United States Patent [19]

Zappala

[11] 4,164,689
[45] Aug. 14, 1979

[54] SAW-TOOTH WAVE GENERATOR

[75] Inventor: Giuseppe Zappala, Turin, Italy

[73] Assignee: Indesit Industria Elettrodomestici Italiana S.p.A., Turin, Italy

[21] Appl. No.: 854,278

[22] Filed: Nov. 23, 1977

[30] Foreign Application Priority Data

Dec. 7, 1976 [IT] Italy ............................. 69912 A/76

[51] Int. Cl.$^2$ ........................ H01J 29/70; H01J 29/76
[52] U.S. Cl. .................................... 315/408; 315/399
[58] Field of Search ....................... 315/408, 399, 410

[56] References Cited

U.S. PATENT DOCUMENTS 3,495,126   2/1970   Dietz ..................................... 315/411

FOREIGN PATENT DOCUMENTS 2433296   3/1975   Fed. Rep. of Germany ........... 315/408

Primary Examiner—Theodore M. Blum
Attorney, Agent, or Firm—Lerner, David, Littenberg & Samuel

[57] ABSTRACT

The invention is concerned with a circuit arrangement for driving a saw-tooth current in a coil primarily intended for use as a line output stage for a television receiver. The circuit arrangement comprises a parallel resonant circuit which incorporates a line deflection coil, a diode connected in parallel with the coil to conduct the deflection current during a first portion of each operating cycle, a second diode and a thyristor connected in series with one another in parallel with the coil, the thyristor being fired by pilot pulses to conduct the deflection current in a second portion of each cycle immediately following the first portion, a series resonant circuit including a capacitor connected in parallel with a thyristor for quenching the thyristor at the end of the second portion of each cycle and a third diode connected in series with the capacitor in a circuit branch connected in parallel with the second diode and serving to transfer energy from the series resonant to the parallel resonant circuit. The circuit offers the advantage that it may readily be adapted to permit modulation of the deflection current and to provide auxiliary voltages unaffected by such modulation.

13 Claims, 7 Drawing Figures $t_0$ $t_1$ $t_2$ $t_3$ $t_4$ $t_5$ $t_6$ $t_7$

SAW-TOOTH WAVE GENERATOR

BACKGROUND OF THE INVENTION

The present invention relates to a circuit arrangement for driving a periodic saw-tooth current in a coil, in particular for use in the line output stage for a television receiver, comprising a unidirectionally conductive device connected in parallel with the coil and thyristor connected in parallel wiith a series resonant circuit, the gate of the thyristor being connected to a source of periodic pilot pulses, to render the thyristor conductive during part of the saw-tooth cycle.

Circuits of this type have been known for some time in which advantage is taken of the robust nature and easy firing characteristics of the thyristors.

However, thyristors are known to have two weak points, namely:

- high-power quenching means are required for extinguishing the thyristor, and
- a certain amount of recovery time is needed from when the current stops until positive voltage is again applied to the anode of the thyristor.

There are two types of known circuits. The first type comprises circuits in which the thyristor is extinguished by a resonant circuit connected in series or parallel to the thyristor, which serves as a one-way switch for "charging" the coil which is then discharged through a diode to restore energy to the supply (see, for example, "I.E.E.E. Transactions on BTR," Nov. 1963, pp 9–22, by S. A. Schwartz and L. L. Ornik). Circuits of this type require four times the normal circulation of reactive energy so that their efficiency is not usually very high.

The second type comprises circuits in which a second thyristor is used to extinguish the first by creating a suitable oscillating current. (See, for example, Italian Pat. No. 812,759). Circuits of this type are complex requiring, among other things, two pilot signals of different phase.

BRIEF DESCRIPTION OF THE INVENTION

The present invention seeks to provide a circuit arrangement for overcoming the problems posed by known circuits for driving a coil with a saw-tooth current.

According to the present invention, there is provided a circuit arrangement for driving a coil with a saw-tooth current comprising a first unidirectionally conductive device connected in parallel with the coil, a thyristor having a gate electrode operative to be connected to a source of pilot signals to render the thyristor conductive during a portion of each cycle of operation, a second unidirectionally conductive device connecting the said coil and the said first unidirectionally conductive device to the thyristor, a circuit branch connected in parallel with the second unidirectionally conductive device and including a third unidirectionally conductive device connected in series with a capacitor, the polarities of the second and third unidirectionally conductive devices being opposed, and means for quenching the thyristor comprising a series resonant circuit incorporating the said capacitor.

An important advantage of the present invention resides in the fact that it may readily be adapted to permit modulation of the deflection current and to provide auxiliary voltages unaffected by such modulation.

According to a second aspect of the invention, there is provided a line output stage for a television receiver comprising a parallel resonant circuit incorporating a line deflection coil, a first unidirectionally conductive device connected in parallel with the coil to conduct the deflection current during a first portion of each operating cycle, a second unidirectionally conductive device and a thyristor connected in series with one another and in parallel with the coil, the thyristor being connectible to receive a firing pulse such as to conduct the deflection current in a second portion of each cycle immediately following said first portion, a series resonant circuit including a capacitor connector in parallel with the thyristor for quenching the latter at the end of said second portion of each cycle and a third unidirectionally conductive device connected in series with the said capacitor in a circuit branch connected in parallel with the second unidirectionally conductive device and serving to transfer energy from said series resonant circuit to said parallel resonant circuit.

BRIEF DESCRIPTION OF THE INVENTION

The invention will now be described, by way of a nonlimiting example, with reference to the accompanying drawings in which:

FIG. 1 is a circuit diagram of a circuit arrangement of the invention for driving saw-tooth current in a coil, and FIGS. 2a to 2f are of the voltage and current waveform appearing selected points in the circuit of FIG. 1.

DETAILED DESCRIPTION OF THE INVENTION

Figure 1:
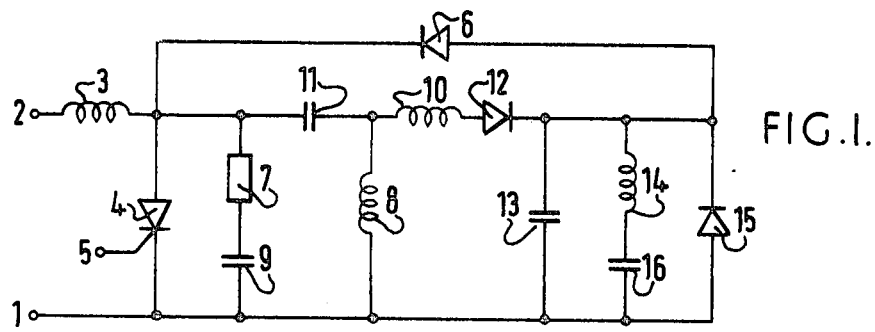

In FIG. 1 numeral 1 and 2 represent two supply terminals. One end of a coil 3 is connected to terminal 2 while its other end is connected to the anode of a thyristor 4 having a gate electrode 5; the cathode of a diode 6; one end of a resistor 7; and one side of a capacitor 11.

The other end of resistor 7 is connected by way of a capacitor 9 to the cathode of thyristor 4, itself connected to terminal 1.

The other side of capacitor 11 is connected by way of a coil 8 to the terminal 1 and by way of a coil 10 to the anode of a diode 12. The cathode of diode 12 is connected to one side of a capacitor 13; to one end of a deflection coil 14; to the anode of a diode 6; and to the cathode of diode 15. The other side of capacitor 13 and the anode of diode 15 are connected to terminal 1, while the other end of the deflection coil 14 is returned to terminal 1 by way of a capacitor 16.

The operation of the circuit will be described with reference to the waveforms in FIG. 2 which are not drawn to scale.

Figure 2A:
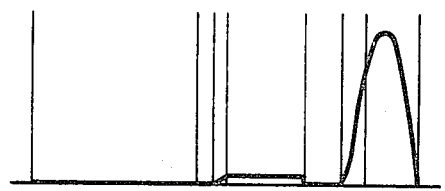
Figure 2B:
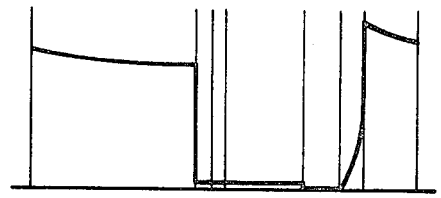
Figure 2C:
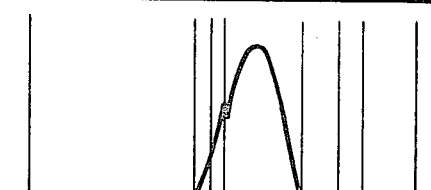
Figure 2D:
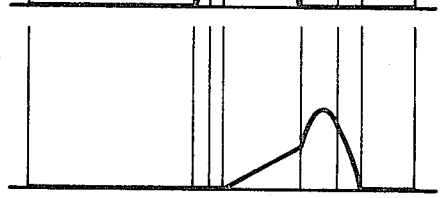
Figure 2E:
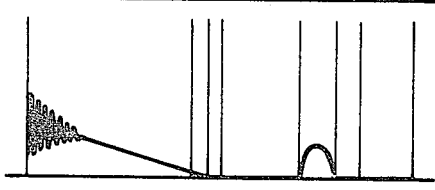
Figure 2F:
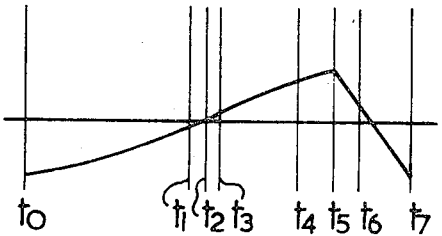

FIG. 2a shows the voltage across the capacitor 13, FIG. 2b shows the voltage across the anode cathode electrodes of thyristor 4, FIG. 2c shows the anode current of thyristor 4, FIG. 2d shows the current in diode 6, FIG. 2e shows the current in diode 15, and FIG. 2f shows the saw-tooth current in the coil 14.

Time is plotted along the 'x' axis, 8 successive instants being marked $t_0$ to $t_7$, respectively.

The interval between $t_0$ and $t_7$ is a complete cycle.

The circuit operates as follows:

A positive voltage is applied to terminal 2. At $t_0$, for reasons later to become apparent, diode 15 is conductive while diode 6 and thyristor 4 are not. In the circuit composed of circuit elements 14, 15 and 16, a current is flowing which decreases more or less constantly. Because of capacitor 16, the current decay is not strictly linear, the capacitor 16 serving to correct the so-called tangent error caused by the fact that the screen curve centre and the centre of deflection do not coincide.

The current in diode 15 is shown in FIG. 2e between $t_0$ and $t_2$.

The voltage across thyristor 4 which is shown in FIG. 2b is more or less constant during the time interval $t_0$–$t_1$.

At $t_1$, a firing pulse is applied to gate 5 of thyristor 4, so that the thyristor is rendered conductive and, the voltage at its anode falls sharply almost to zero (FIG. 2b) while the current in the thyristor increases (FIG. 2c). The current in the thyristor is essentially the oscillating current produced in the circuit composed of the elements 8 and 11. This current is essentially sinusoidal, reaches a maximum between $t_3$ and $t_4$ and then falls to zero at $t_4$.

In the meantime, at time $t_2$, the current through diode 15 has fallen to zero so that the diode 15 ceases to conduct. Almost immediately, however, at time $t_3$, diode 6 is forward biased so that the deflection current of coil 14 can continue to flow through diode 6 and thyristor 4.

At $t_4$ the oscillatory current of the circuit comprised of elements 8–11 changes polarity so that the thyristor is extinguished or quenched while diode 15 is once more made conductive and the oscillatory current of circuits 8–11 flows in diodes 15 and 6 (FIGS. 2d and 2e, $t_4$ to $t_5$). At time $t_5$ the current of circuit 8–11 is once more inverted so that diode 15 ceases to conduct. As thyristor 4 is also disabled, there is no direct path for the first time since $t_0$ for the current of deflection coil 14.

As diode 6 is still conductive, if we ignore for the time being the branches consisting of coil 3 and series circuit 10–12 which are high-impedance as compared with the other elements, the oscillating circuit between $t_5$ and $t_6$, that is, while diode 6 is conducting, consists essentially of elements 13–14 which form a parallel resonant circuit and elements 8–11 which form a series resonant circuit.

The voltage at across the terminals of condenser 13 rises sharply to a maximum (FIG. 2a) after which it starts falling again. This voltage is essentially the sum of two sinusoids of different frequencies which are the frequencies of the resonant circuit 8–11 and 13–14.

At time $t_6$, the current in diode 6 falls to and the diode is disabled.

As the voltage across the terminals of condenser 13 falls sharply to zero, the voltage across thyristor 4 rises (as a result of the voltage of capacitor 11) as shown in FIG. 2b, $t_6$.

This phase between $t_6$ and $t_7$ is important as it is during this phase that the deflection circuit (13–14) receives the energy for making up losses from the remainder of the circuit (elements 10–11–12). It is the connection consisting of elements 10 and 12 which enables current to flow in diode 6 during the first retrace or fly-back interval ($t_5$–$t_6$) and energy to be supplied to the deflection circuit (13, 14) during the second.

At $t_7$, when the voltage across the terminals of condenser 13 is inverted, diode 15 is once more made conductive, which brings us back to where we started ($t_0$).

Resistor 7 and condenser 9 form a small unit for dampening the parasitic oscillation produced at the terminals of the thyristor 4 when diode 6 is disabled ($t_6$).

From this description, it will be clear that the resonant circuit 11–8 serves to extinguish the thyristor 4 by inverting the voltage across the thyristor terminals. Branch 10–12 serves to transfer energy to the deflection circuit (13–14–15–16) so as to compensate for the energy dissipated in the form of heat.

The circuit described can also be used for modulating deflection energy (that is, deflection current) as required in colour televisions (E–W correction). This can be done by merely controlling the energy transferred through branch 10–12 to the deflection circuit (13, 14, 15, 16). This can be done in either of two ways, namely:
 by replacing diode 12 with a thyristor so as to control conduction time by anticipating or delaying the firing of the thyristor;
 by introducing a variable load (passive modulator) so as to shunt part of the energy parallel to diode 15. In this way, the energy applied to the deflection circuit can be made variable.

In this way, deflection current can be regulated within a wide range with no serious effect on the amplitude of the voltage at the terminals of the thyristor. If coil 3 is the primary of a transformer having secondary windings with a suitable number of turns, it is possible to obtain various voltages, unaffected by the said modulation, for various functions, for example, the EHT voltage for the C.R.T. (E.H.V.) or low voltages for auxiliary circuits (12, 24 V, etc.).

The advantages of the circuit arrangement according to the present invention will be clearly seen from the description given. To those skilled in the art, it will be clear that variations can be made to the circuit described without, however, departing from the scope of the present invention.

I claim:

1. A circuit arrangement for providing a deflection coil with a saw-tooth current having a cycle comprised of a trace and a retrace portion, comprising a first unidirectionally conductive device connected parallel with said coil, a thyristor having a gate electrode operative to be connected to a source of pilot signals to render the thyristor conductive during a portion of each cycle of operation, a second unidirectionally conductive device connecting said coil and said first unidirectional conductive device to the thyristor, a branch circuit connected in parallel with the second unidirectionally conductive device and comprising a third unidirectionally conductive device connected in series with a capacitor, the second and third unidirectionally conductive devices being coupled to said coil in opposite polarity and means comprising means for forming a series resonant circuit with the aforesaid capacitor for quenching said thyristor prior to the completion of the trace portion of the sawtooth current operating cycle.

2. A circuit arrangement as claimed in claim 1, in which an inductor is connected in series with the said third unidirectionally conductive device.

3. A circuit arrangement as claimed in claim 1, in which a supply source is connected to the said circuit arrangement so that current supplied to the thyristor by said source does not pass through the said second unidirectionally conductive device.

4. A circuit arrangement as claimed in claim 1, in which the circuit components are so designed that they commence to conduct in the trace interval between fly-back portions of the saw-tooth current in the coil in the following order, namely:
 said first unidirectionally conductive device;
 said thyristor;
 said second unidirectionally conductive device; and
 once again said first unidirectionally conductive device.

5. A circuit arrangement as claimed in claim 1, in which, during a first part of the fly-back interval, the said second unidirectionally conductive device is conductive, and in which the thyristor and both of said first and second unidirectionally conductive devices do not conduct during the second part of the fly-back interval.

6. A circuit arrangement as claimed in claim 1, in which, during the trace interval, five phases are distinguishable in the following order, namely:
- a first phase in which only the said first unidirectionally conductive device is conductive;
- a second phase in which both the said first unidirectionally conductive device and the said thyristor are conductive;
- a third phase in which only the said thyristor is conductive;
- a fourth phase in which both the said thyristor and the said second unidirectionally conductive device are conductive; and
- a fifth phase in which both the said second and the said first unidirectionally conductive device are conductive.

7. A circuit arrangement as claimed in claim 1, in which said first unidirectionally conductive device is a diode.

8. A circuit arrangement as claimed in claim 1, in which the said second unidirectionally conductive device is a diode.

9. A circuit arrangement as claimed in claim 1, in which the said third unidirectionally conductive device is a diode.

10. A circuit arrangement as claimed in claim 1, in which the energy applied to the said diffection coil through the said third unidirectionally conductive device from the said series resonant circuit is periodically variable.

11. A circuit arrangement as claimed in claim 10, in which the said energy is made variable by introducing a variable load parallel to the said first unidirectionally conductive device.

12. A circuit arrangement as claimed in claim 10, in which said third unidirectionally conductive device is a diode and the said energy is made variable by varying the instant in which the said thyristor is fired.

13. A line output stage for a television receiver comprising a parallel resonant circuit incorporating a line deflection coil, a first unidirectionally conductive device connected in parallel with the said parallel resonant circuit to conduct the deflection current during a first portion of each operating cycle, a second unidirectionally conductive device and a thyristor connected in series with one another in a branch circuit, said branch circuit being arranged in parallel with the said parallel resonant circuit, the said thyristor having a trigger electrode for receiving a firing pulse to conduct the deflection current in said coil in a second portion of each cycle immediately following said first portion, a series resonant circuit operating at a resonant frequency at least equal to and preferably greater than the frequency of the deflection current and including a capacitor and being connected in parallel with the said thyristor for quenching the said thyristor at the end of said second portion of each cycle and a third unidirectionally conductive device connected in series with the said capacitor in a second branch circuit connected in parallel with the second unidirectionally conductive device and serving to transfer energy from said series resonant circuit to said parallel resonant circuit.

* * * * *